United States Patent
Lew et al.

(10) Patent No.: US 10,594,338 B1
(45) Date of Patent: Mar. 17, 2020

(54) ADAPTIVE QUANTIZATION

(71) Applicant: WaveOne Inc., Mountain View, CA (US)

(72) Inventors: Carissa Lew, San Jose, CA (US);
Steven Branson, Woodside, CA (US);
Oren Rippel, Mountain View, CA (US);
Sanjay Nair, Fremont, CA (US);
Alexander Grant Anderson, Mountain View, CA (US); Lubomir Bourdev, Mountain View, CA (US)

(73) Assignee: WaveOne Inc., Mountain View, CA (US)

(*) Notice: Subject to any disclaimer, the term of this patent is extended or adjusted under 35 U.S.C. 154(b) by 0 days.

(21) Appl. No.: 16/356,201

(22) Filed: Mar. 18, 2019

(51) Int. Cl.
| | |
|---|---|
| *H03M 7/30* | (2006.01) |
| *G06F 17/18* | (2006.01) |
| *H03M 7/02* | (2006.01) |
| *G06N 20/00* | (2019.01) |
| *G06N 3/08* | (2006.01) |
| *H04N 19/132* | (2014.01) |

(52) U.S. Cl.
CPC .......... *H03M 7/3066* (2013.01); *G06F 17/18* (2013.01); *G06N 3/084* (2013.01); *G06N 20/00* (2019.01); *H03M 7/02* (2013.01); *H04N 19/132* (2014.11)

(58) Field of Classification Search
None
See application file for complete search history.

(56) References Cited

U.S. PATENT DOCUMENTS

| | | | | |
|---|---|---|---|---|
| 2003/0053706 A1* | 3/2003 | Hong | ...................... | G06T 9/005 382/253 |
| 2012/0275718 A1* | 11/2012 | Takamori | ................. | G06K 9/36 382/238 |
| 2018/0176578 A1* | 6/2018 | Rippel | ................. | G06K 9/6256 |

OTHER PUBLICATIONS

Agustsson, E. et al., "Generative Adversarial Networks for Extreme Learned Image Compression," arXiv:1804.02958v2, Oct. 23, 2018, pp. 1-27.
Ballé, J. et al., "Variational Image Compression with a Scale Hyperprior," arXiv:1802.01436v2, May 1, 2018, pp. 1-23.

* cited by examiner

*Primary Examiner* — Howard Williams
(74) *Attorney, Agent, or Firm* — Fenwick & West LLP

(57) ABSTRACT

A compression system includes an encoder and a decoder. The encoder can be deployed by a sender system to encode a tensor for transmission to a receiver system, and the decoder can be deployed by the receiver system to decode and reconstruct the encoded tensor. The encoder receives a tensor for compression. The encoder also receives a quantization mask and probability data associated with the tensor. Each element of the tensor is quantized using an alphabet size allocated to that element by the quantization mask data. The encoder compresses the tensor by entropy coding each element using the probability data and alphabet size associated with the element. The decoder receives the quantization mask data, the probability data, and the compressed tensor data. The quantization mask and probabilities are used to entropy decode and subsequently reconstruct the tensor.

40 Claims, 7 Drawing Sheets

ADAPTIVE QUANTIZATION

BACKGROUND

Field of Art

This disclosure relates generally to encoding and decoding content, and in particular to adaptively quantizing elements of a tensor based on a quantization mask.

Description of Art

Various systems transmit information to and from one another over a network, or store compressed information for later access. The information may be, for example, content such as an image or video, audio, or a string of text such as an e-mail or text document. Typically, the sender encodes the information into a compressed code such that the compressed code can be efficiently transmitted to the receiver. The receiver can then decode the compressed code to reconstruct the original information. For example, responsive to a request to download a particular image from a client device, an image sharing website may encode the image and transmit the compressed code to the client device. The sender may also compress the information into different levels according to the available bandwidth at the sender or receiver.

Often, it is advantageous for certain portions of content to be encoded with a different degree of information over others. For example, these portions may be allocated a greater number of bits in the compressed code and are reconstructed at the receiver at a higher quality than the remaining portions of the content. The image sharing website may desire to preferentially encode regions of an image associated with human faces over those associated with the background, since viewers tend to focus greater attention on the human faces. However, it is often difficult to adaptively encode such regions of interest with good accuracy and computational efficiency.

SUMMARY

A compression system compresses tensors by adaptively quantizing individual elements of the tensor and compressing each of the tensor elements according to its level of quantization. The compression system includes an encoding system and a decoding system. The encoding system can be deployed by a sender system to compress a tensor for storage or transmission to a receiver system. The decoding system can be deployed at the receiver system to decode and reconstruct the compressed tensor.

The encoding system receives a tensor for compression. In addition, the encoding system receives a quantization mask identifying different alphabet sizes for use in quantizing each of the elements of the tensor. The encoding system also receives a set of probability values representing likelihoods that an element of the tensor will be a certain value. Each element of the tensor is quantized using the alphabet size available to that element as indicated by the quantization mask. The quantized tensor is compressed using a variant of entropy coding, where each element of the quantized tensor is entropy coded using the probability associated with the element being certain values and the quantization mask data. The probability data and quantization mask are also compressed. The entropy coded tensor code, quantization mask data, and probability data are transmitted over a network to a receiver system.

At a receiver equipped with the decoding system, the entropy coded tensor code is decompressed to generate a reconstruction of the original tensor. The decoding system uses the quantization mask data and the probability data to entropy decode each of the elements of the tensor code.

In some embodiments, the compression system is configured to include functionality for generating the tensor from input content. For example, an autoencoder comprising an encoding portion and a decoding portion may be trained to generate a tensor from an input image and then to reconstruct the image using a quantized tensor.

The compression system may also include functionality for generating the quantization mask, in accordance with an embodiment. A quantization mask generator may include a neural network that is trained to identify areas of importance in a content item (e.g., human faces in an image) and to indicate the relative areas of importance in a resulting tensor.

Additionally, the compression system may include functionality for generating the probability data associated with the likelihoods of tensor elements having certain values. One way of producing probability values is to employ a subnetwork comprising an autoencoder that is trained to generate probability predictions given the tensor.

The features and advantages described in this summary and the following detailed description are not all-inclusive. Many additional features and advantages will be apparent to one of ordinary skill in the art in view of the drawings, specification, and claims hereof.

The figures depict an embodiment of the invention for purposes of illustration only. One skilled in the art will readily recognize from the following description that alternative embodiments of the structures and methods illustrated herein may be employed without departing from the principles of the invention described herein.

DETAILED DESCRIPTION

Figure 1A:
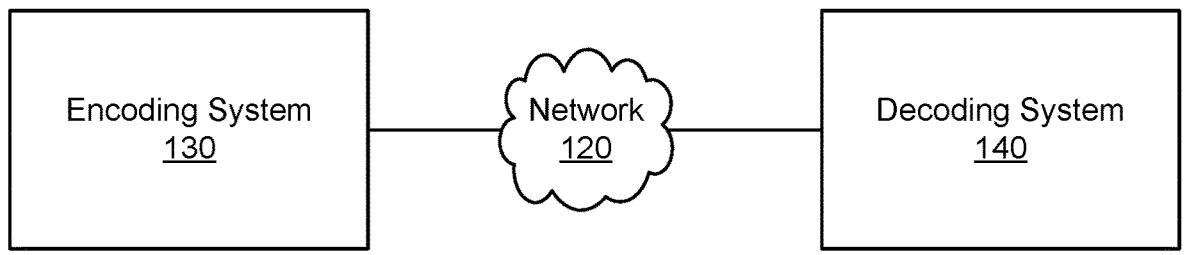
FIG. 1A is a high-level block diagram of a system environment including an encoding system and a decoding system interacting over a network, in accordance with an embodiment.
Figure 1B:
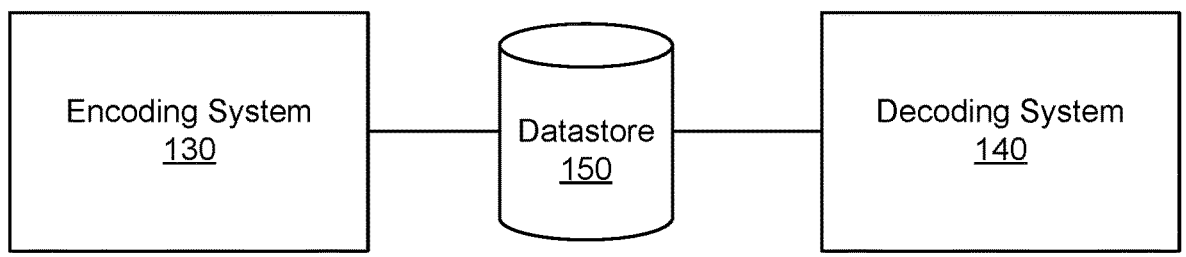
FIG. 1B is a high-level block diagram of a system environment including an encoding system and a decoding system interacting via a data store, in accordance with an embodiment.

Figure (FIG. 1A is a high-level block diagram of a system environment including an encoding system and a decoding system interacting over a network, in accordance with an embodiment. The system environment shown in FIG. 1A comprises an encoding system 130, a decoding system 140, and a network 120. In alternative configurations, different and/or additional components may be included in the system environment. For example, FIG. 1B is a high-level block diagram of a system environment including an encoding system 130 and a decoding system 140 interacting via a data store 150, in accordance with another embodiment.

The encoding system 130 adaptively quantizes portions of a tensor and compresses the quantized tensor using entropy coding. The encoding system 130 can be deployed to encode content for transmission to a decoding system 140. The encoding system 130 is configured to receive tensor data and output a compact bitstream representation of the tensor, as well as quantization and probability information to be used in the entropy decoding process. In some embodiments the encoding system 130 may further include functionality for encoding content such as images, videos, text, or another input format.

The decoding system 140 implements a decoder that uses entropy decoding to decompress a bitstream. The decoding system 140 can be deployed to decode content received from the encoding system 130. The decoding system 140 is configured to receive a bitstream including a compressed representation of tensor data, as well as quantization and probability data for the entropy decoding process. In some embodiments, the decoding system 140 can include functionality for generating a reconstructed version of content that is represented by the tensor data.

In the example of FIG. 1A, a bitstream may be transferred from the encoding system 130 to the decoding system 140 via the network 120. The network 120 may comprise any combination of local area and wide area networks employing wired or wireless communication links. In some embodiments, all or some of the communication on the network 120 may be encrypted.

In some cases, a bitstream may be sent directly over the network 120 from the encoding system 130 to the decoding system 140. As one example, a video messaging system may employ the encoding system 130 to compress the message content and may send the message over the network 120 to the decoding system 140 at a client device of a recipient user in near real time.

In other cases, the bitstream data may be used as a way to store the tensor data in a compressed manner until it is needed at a later time. The example of FIG. 1B includes the encoding system 130, the decoding system 140, and a datastore 150. In some embodiments, the output of the encoding system 130 may be stored in one or more datastores 150 until the decoding system 140 retrieves the bitstream to decode the tensor data.

The encoding system 130 and decoding system 140 described herein provide a system for compression and subsequent reconstruction of a tensor. The tensor may be data representing content, e.g., an input image, video frame, audio file, or text file. In one example embodiment, the input tensor associated with image content may be generated by a neural network architecture, such as by an encoding portion of an autoencoder. The complexity of an input, such as an image, and the areas of importance of the input, vary spatially. The encoding system 130 adapts the compression in view of the spatial variance of the complexity and areas of importance. The encoding system 130 achieves this adaptation by applying information from a quantization mask that indicates how much bandwidth should be used for compressing data at each spatial location of the tensor.

In particular, the encoding system 130 can vary the alphabet size used to quantize data at each element of the tensor. A smaller alphabet size results in coarser quantization of the data at that element of the tensor, which leads to a larger reconstruction error during the decoding process. The encoding system 130 uses a quantization mask (e.g., in the form of a heatmap) to indicate an alphabet size that should be used for quantizing the data at each element of the tensor.

To compress the quantized tensor data using a form of entropy coding, the encoding system 130 requires information about the likelihood of occurrence of each value of an alphabet at each tensor element. In some embodiments, the encoding system 130 receives a set of probability distributions from an external source for use in compressing the tensor. In other embodiments, the encoding system may compute the probability values based on pre-quantized tensor data. Generating probability values for a tensor element based on previously analyzed neighboring tensor elements can be computationally unfeasible when using alphabet sizes greater than two values (i.e., because the state space of all possible combinations of neighbor values is huge). To address this, the encoding system 130 may include a separate autoencoder network comprising sub-encoder and a sub-decoder portions. The sub-encoder receives the pre-quantized tensor as input and the sub-decoder outputs a predicted probability distribution at each tensor element.

The encoding system 130 uses the predicted probabilities at each tensor element, in conjunction with the tensor data quantized based on the quantization mask, to compress each tensor element using entropy coding. Compressed versions of the entropy coded tensor data, the probability distributions, and the quantization mask are provided to the decoding system 140 via the network 120 or a datastore 150. The decoding system 140 can reconstruct the tensor data with entropy decoding using the quantization mask data and the probability distribution data to decode each element of the tensor.

Figure 2A:
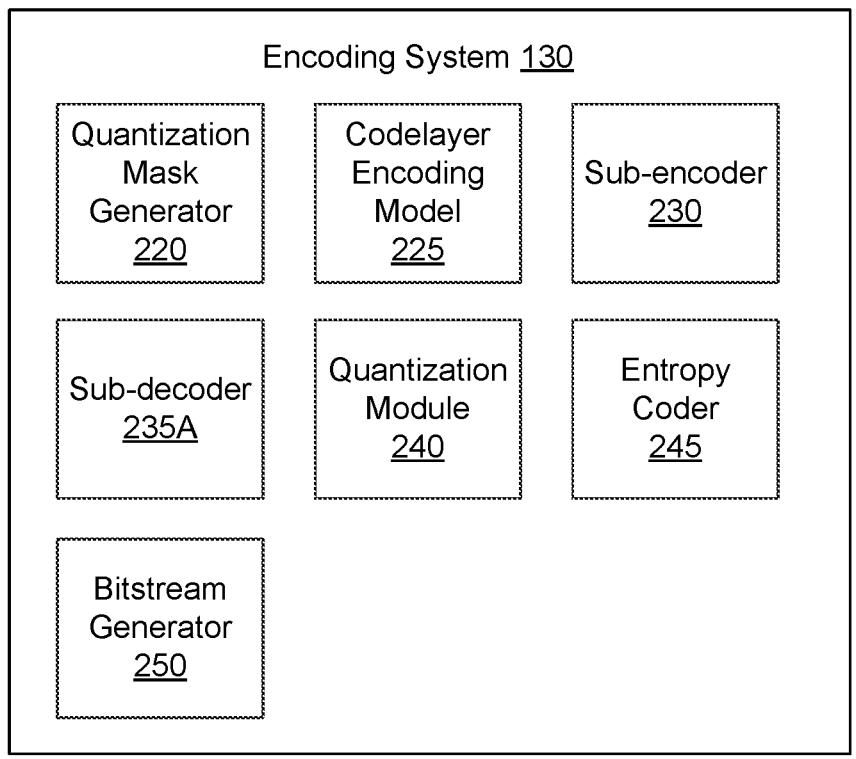
FIG. 2A is a high-level block diagram of the encoding system architecture, in accordance with an embodiment.

FIG. 2A is a high-level block diagram of the encoding system 130 architecture, in accordance with an embodiment. The encoding system 130 includes a quantization module 240, an entropy coder 245, and a bitstream generator 250. In some embodiments, the encoding system 130 may additionally include a quantization mask generator 220, a codelayer encoding model 225, a sub-encoder 230, and a sub-decoder 235A. The functions performed by the various entities of FIG. 2A may vary in different embodiments. The encoding system 130 may contain more, fewer, or different components than those shown in FIG. 2A, and the functionality of the components as described herein may be distributed differently from the description herein.

The quantization mask generator 220 generates quantization masks for use in entropy coding. In one embodiment, the quantization mask generator 220 comprises a neural network that is trained to accept a tensor or content as input and to output a quantization mask. For example, the quantization mask for image content may be in the form of a heatmap that identifies more detailed areas of the image. The quantization mask generator 220 may be trained separately from the rest of the encoding system 130 modules, or in other embodiments may be trained jointly with other neural network modules of the encoding system 130. In some cases, the encoding system 130 may receive quantization masks from an external quantization mask generator 220.

A quantization mask identifies how accurate reconstructions of different portions of the tensor need to be after the encoding and decoding process. For example, when encoding an image, the quantization mask may identify areas of a tensor that correspond to faces in the original image as requiring more detailed reconstruction and may identify areas of the tensor that correspond to areas of sky in the original image as requiring less detailed reconstruction. The quantization mask data is interpreted by various modules of the encoding system 130 and decoding system 140 to determine an alphabet size that should be used for quantizing the data at each element of a given tensor. For example, the quantization mask could allot a large alphabet size for quantizing the tensor elements associated with faces in an image and could similarly indicate that a small alphabet size should be used to quantize the tensor elements associated with sky in the image. The quantization mask generator may be trained to produce quantization masks that account for information other than whether an area of content is more or less detailed when determining quantization values to associate with different tensor elements. In one embodiment, the quantization mask values are selected or determined by the quantization mask generator 220 to result in a spatially constant reconstruction of the tensor when the tensor is reconstructed at the decoding system 140. In another embodiment, the quantization mask values are selected or determined by the quantization mask generator 220 to maximize the reconstruction quality for a targeted bitrate determined by requirements of the network 120. In another embodiment, the values of the quantization mask may be selected or determined by the quantization mask generator 220 to result, for each spatial location of the tensor, in a minimum quality improvement per unit bitrate above a predetermined threshold value. In another embodiment, the values of the quantization mask may be selected or determined by the quantization mask generator 220 to provide an input to another neural network that learns a semantic understanding of the tensor elements. For example, a quantization mask that produces tensor elements associated with faces is provided to a neural network that recognizes the facial expression of the faces.

In one embodiment, the quantization mask generator 220 generates one quantization mask for use on all channels of an input tensor. In another embodiment, the quantization mask generator 220 can specify a different mask value for each of a set of input channels (e.g., color channels for an image tensor) at each spatial location. In some cases, the maximum alphabet size to be used at each element of a tensor can vary by channel. In this case, the quantization mask may be a float (i.e., value from 0 to 1) that can be scaled to the alphabet size that is applicable for the corresponding channel.

The codelayer encoding model 225 takes in content as input and produces tensors for encoding. In some embodiments, the encoding system 130 receives tensors from an external source rather than producing the tensors locally at a codelayer encoding model 225. In one embodiment, the codelayer encoding model 225 comprises a first portion of an autoencoder that includes the codelayer encoding model 225 and a codelayer decoding model 265, which is further described with respect to FIG. 2B. During a training phase, the codelayer encoding model 225 is trained to generate a tensor from an input, such as an image, and the codelayer decoding model is trained to reconstruct the input given the tensor.

In some embodiments, the encoding system 130 may receive probability distributions associated with the tensor from a third-party system. In other embodiments, the encoding system 130 generates the probabilities associated with the tensor elements. In one case, the encoding system 130 may predict probability values by analyzing the tensor values sequentially and using the previously determined probability values or the probability values of neighboring tensor elements to predict a probability value for a next tensor element. In another embodiment, the encoding system 130 may use an autoencoder network whose input is a tensor (e.g., as produced by the codelayer encoding model), and whose output is the probability distribution of values at each tensor element. The autoencoder network comprises a sub-encoder 230 and a sub-decoder 235. The sub-encoder 230 produces a probability codelayer that can be compressed and transmitted as a part of a bitstream to the decoding system 140 for use in decoding and reconstructing the encoded tensor. In one embodiment, the autoencoder network comprising the sub-encoder 230 and the sub-decoder 235 performs neural network operations using integer-only math. Using integer-only math ensures that predicted probability values or probability distributions will be the same even when the operations are performed on differing hardware architectures. It is important for the encoding system 130 and the decoding system 140 to have the same probability distributions so that the decoding system 140 produces an accurate reconstruction of the input. Operating with integers avoids issues that may arise when different computer architectures operate differently with respect to floats.

The sub-decoder 235 receives as input a quantized version of the probability codelayer that was produced by the sub-encoder 230 and generates the probability distribution of values at each element of the input tensor. In one embodiment, the sub-decoder 235 predicts a probability associated with each value of the alphabet at each element of the tensor, in view of the alphabet size for that tensor element. This approach produces a channel by height by weight by alphabet size ($C \times H \times W \times A$) set of probability values. In another embodiment, the sub-decoder 235 predicts a parametric representation of the probability distribution over the possible values of the alphabet for each tensor element. For example, the sub-decoder could be trained to use a Gaussian distribution and predict the mean and standard deviation at each element of the tensor, outputting a $C \times H \times W \times 2$ size set of probabilities. In this case, the sub-decoder 235 produces a mean and a standard deviation representing probable values for each element of the input tensor.

The quantization module 240 quantizes the tensor data to prepare the tensor for entropy coding. In some embodiments, the quantization module 240 also quantizes the quantization mask produced by the quantization mask generator 220 and the probability codelayer produced by the sub-encoder 230. In one embodiment, it is the quantized quantization mask that provides alphabet size data for using to quantize the input tensor. In particular, the quantization mask indicates an alphabet size that should be used for quantizing the data at each element of the tensor.

The entropy coder 245 uses entropy coding to compress the quantized data. Entropy coding algorithms are compression techniques that use probability values associated with the likelihood of occurrence of each of a set (i.e., alphabet) of possible input characters to represent the input with variable-length representations of the characters (i.e., allowing common characters to be represented using less bandwidth than uncommon characters). In one embodiment, the entropy coder 245 separately encodes the quantized tensor data, the alphabet size data (i.e., the quantized quantization mask), and the quantized probability codelayer. Examples of entropy coding algorithms that may be implemented by the entropy coder 245 include arithmetic range coding, Asymmetric Numeral Systems, Huffman coding, and range coding. The entropy coder 245 uses the probability predictions from the sub-decoder 235A and the alphabet size data obtained from the quantization mask to encode the tensor data such that each tensor element is encoded using the corresponding alphabet size, as indicated by the quantization mask.

The bitstream generator 250 receives a tensor code comprising the compressed tensor data, a quantization code comprising the quantization mask data, and a probability subcode comprising the probability data, as output by the entropy coder 245, and generates a bitstream for sending to the decoding system 140 over the network 120 or for storage at a datastore 150.

Figure 2B:
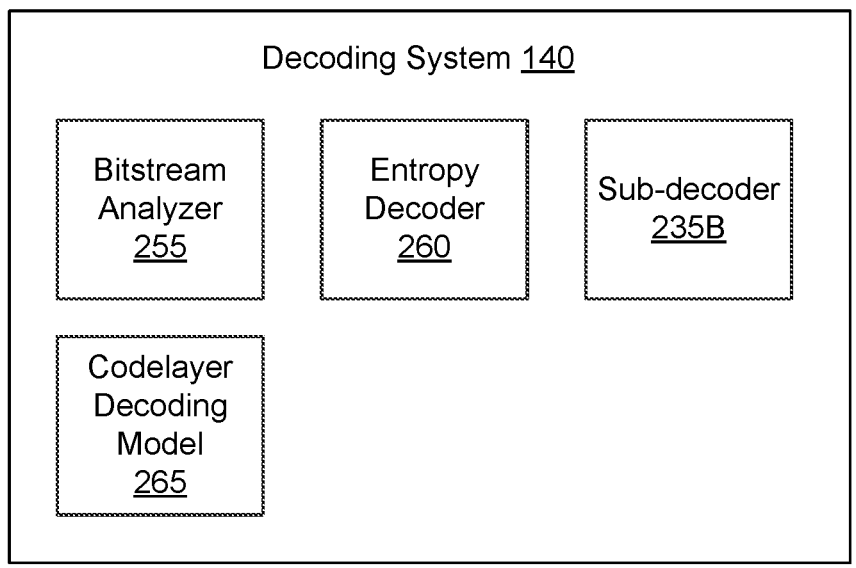
FIG. 2B is a high-level block diagram of the decoding system architecture, in accordance with an embodiment.

FIG. 2B is a high-level block diagram of the decoding system 140 architecture, in accordance with an embodiment. The decoding system 140 decompresses and reconstructs the tensor data. The decoding system 140 includes a bitstream analyzer 255, and an entropy decoder 260. In some embodiments, the decoding system 140 further includes a sub-decoder 235B and a codelayer decoding model 265. The functions performed by the various entities of FIG. 2B may vary in different embodiments. The decoding system 140 may contain more, fewer, or different components than those shown in FIG. 2B, and the functionality of the components as described herein may be distributed differently from the description herein.

The bitstream analyzer 255 receives a bitstream from a datastore 150 or over a network 120. The bitstream analyzer 255 identifies the different portions of the bitstream for analysis, in particular, separating the received data into the quantization code, the tensor code, and the probability subcode.

The entropy decoder 260 decompresses the quantization code, the probability subcode, and the tensor code. In one embodiment, the entropy decoder 260 decodes the quantization code to obtain the alphabet size data represented by the quantized quantization mask. The entropy decoder 260 also decodes the probability subcode to obtain the quantized probability codelayer.

In embodiments that include an autoencoder network for predicting probabilities, a sub-decoder 235B at the decoding system 140 receives the probability codelayer from the entropy decoder 260 and uses the probability codelayer as input to produce the probability predictions. The sub-decoder 235B is a copy of the sub-decoder 235A included in the encoding system 130.

The entropy decoder 260 uses the probability predictions and the alphabet size values from the quantization mask to entropy decode each of the tensor elements and reconstruct the tensor.

The codelayer decoding model 265 is the second portion of the autoencoder that comprises the codelayer encoding model 225 and the codelayer decoding model 265. In some embodiments, the decoding system 140 produces a reconstructed tensor. In other embodiments, the decoding system 140 reconstructs content by providing the reconstructed tensor as input to the codelayer decoding model 265 which is trained to output a reconstruction based on a given tensor.

Figure 3A:
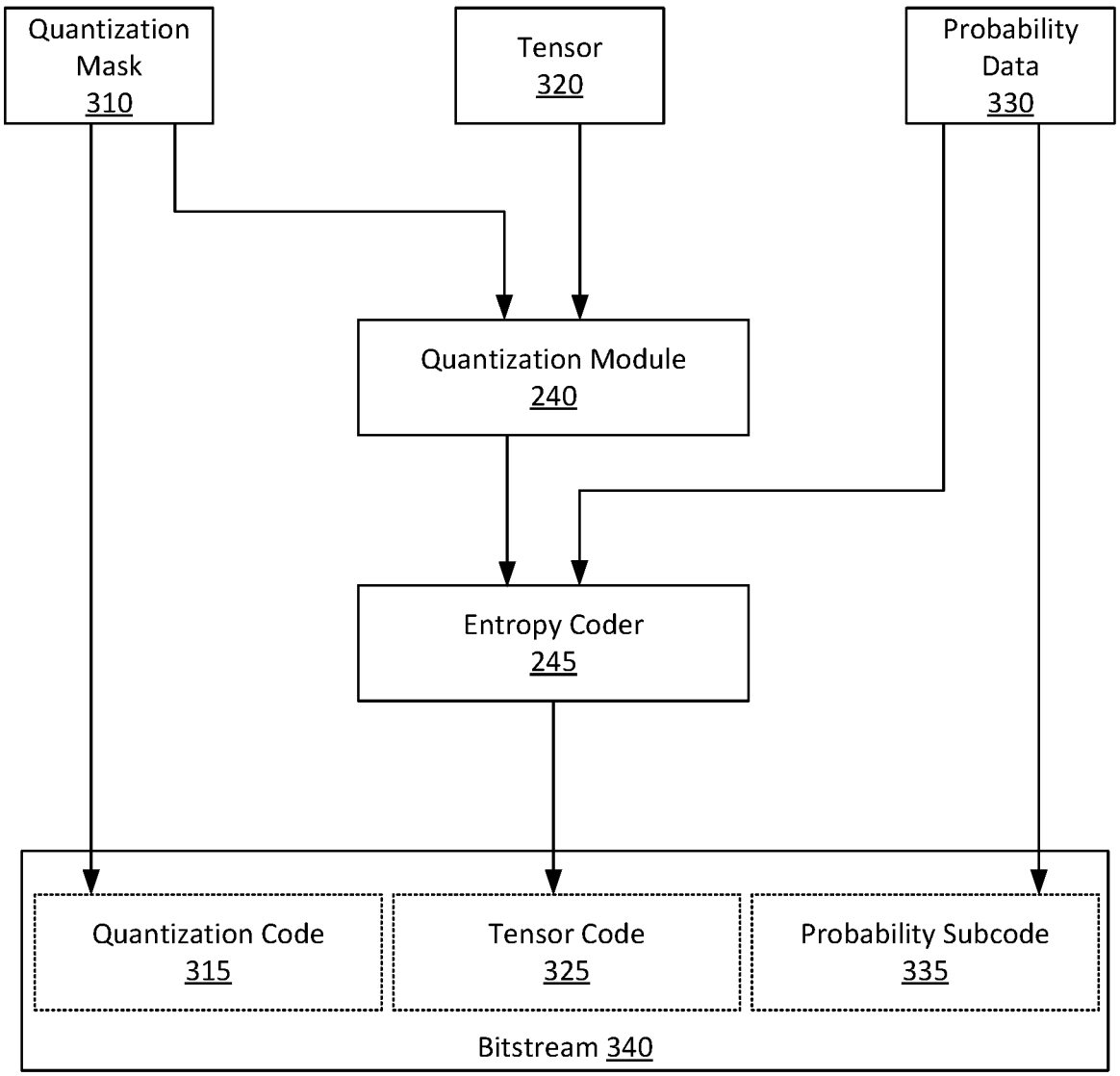
FIG. 3A illustrates a process for deploying the encoding system, in accordance with an embodiment.

FIG. 3A illustrates a process for deploying the encoding system 130, in accordance with an embodiment. In particular, the process of FIG. 3A describes compressing a tensor using adaptive quantization. The quantization module 240 receives a tensor 320 for compression. The tensor 320 comprises a set of tensor elements, each element having a value. The quantization module 240 additionally receives a quantization mask 310, that identifies, for each element of the tensor, an alphabet size that the quantization module 240 should use to quantize the value at the element. Using the quantization mask 310, the quantization module 240 produces a quantized version of the tensor 320, wherein each tensor element is quantized according to the corresponding alphabet size. The quantized tensor is provided to the entropy coder 245.

In addition to the quantized tensor, the entropy coder 245 receives probability data 330. Like the quantization mask 310, the probability data 330 includes probability information associated with each element of the tensor 320. Specifically, the probability data 330 describes, for each element of the tensor 320 likelihoods associated with the element having different possible values.

The entropy coder 245 uses the probability data 330 to encode the quantized tensor produced by the quantization module 240. The entropy coder 245 encodes each element of the quantized tensor using a form of entropy coding wherein the probability value used for encoding each element of the quantized tensor is the probability value corresponding to the tensor element in the probability data 330. A tensor code 325 that includes the compressed elements of the quantized tensor is produced by the entropy coder 245.

The decoding system 140 needs the quantization mask 310 and the probability data 330 that were used to encode the elements of the quantized tensor in order to decode and reconstruct the tensor 320. Accordingly, the quantization mask 310 and probability data 330 are compressed into a quantization code 315 and a probability subcode 335, respectively, prior to being included in the bitstream 340. For example, a version of entropy encoding may be used to compress the quantization mask 310 into the quantization code 315, and a version of entropy encoding may be used to compress the probability data 330 into the probability subcode 335. The bitstream 340 may be transmitted over the network 120 or may be stored in a datastore 150.

In one embodiment, the encoding system 130 can refine the quantized tensor to make it more compressible before providing the quantized tensor to the entropy coder 245. Specifically, for each element of the tensor, the quantization module 240 may compute a cost of transmitting each of the possible alphabet-size values as a linear combination of a reconstruction cost of reconstructing the element and an entropy cost of the element. A value associated with the lower total cost may be chosen for representing the quantized tensor value. That is, it may be less costly to use a quantization bin (e.g., alphabet value) that neighbors the original quantization bin for a tensor element. The cost associated with this tradeoff may be calculated as:

$$\text{cost}(i) = \text{resconstruction\_cost}(a_i, a) + \lambda(\text{entropy\_cost}(a_i))$$

wherein a is the original value of the quantized tensor, and $a_i$ is another value in the available alphabet (i.e., $0 \leq i < \text{alphabet\_size}$). The $\lambda$ value represents a trade-off between how compact the compression is (i.e., entropy cost) and how lossy the compression is (i.e., reconstruction cost). When $\lambda$ is 0, the result of applying the equation is the standard lossless compression. The entropy_cost can be thought of as the number of bits needed to encode and is $-\log_2(\text{prob}(a))$ where prob(a) is the probability assigned to element $a_i$. The reconstruction cost is a measure of how close the reconstructed element is to the original element. Thus, the quantization module 240 may adjust the value of an element of the tensor to minimize a weighted average of an entropy of compressing the element and a difference between the value of the element and the adjusted value of the element.

Figure 3B:
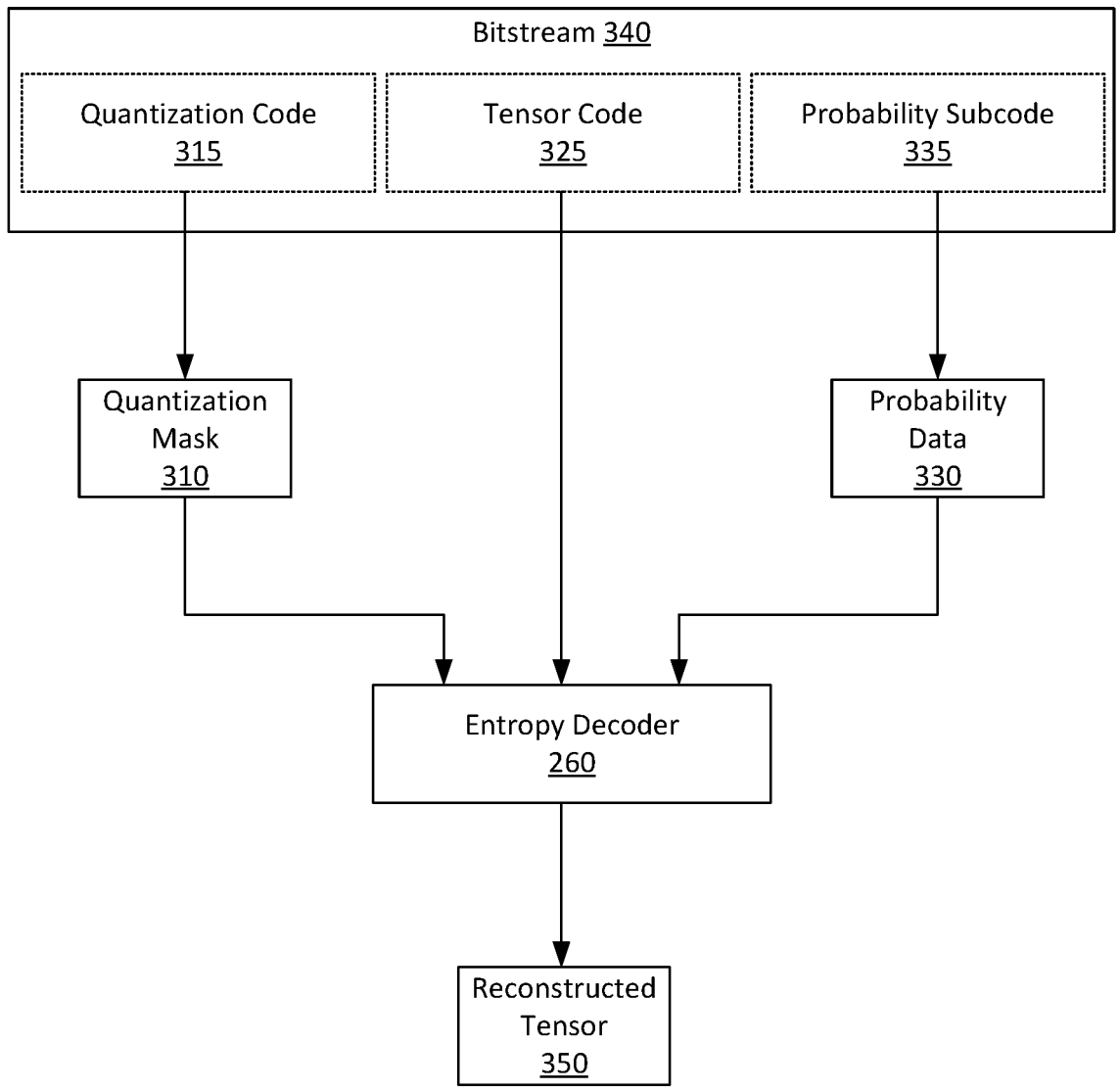
FIG. 3B illustrates a process for deploying the decoding system, in accordance with an embodiment.

FIG. 3B illustrates a process for deploying the decoding system 140, in accordance with an embodiment. In particular, FIG. 3B shows a process of decompressing a tensor using adaptive quantization. The decoding system 140 receives the bitstream 340. In some embodiments, the bitstream 340 includes the quantization code 315, the tensor code 325, and the probability subcode 335. The decoding system 140 decodes the quantization code 315 to obtain the quantization mask 310. The decoding system 140 also decodes the probability subcode 335 to obtain the probability data 330. In various embodiments, the decoding system 140 may decompress the quantization code 315 and the probability subcode 335 using a form of entropy decoding or whichever decoding technique complements the technique that was used to encode the values at the encoding system 130. The quantization mask 310 and the probability data 330 are used by the entropy decoder 260 to decode the tensor code 325 and produces a reconstructed tensor 350. The entropy decoder 260 decodes each element of the tensor using the probability value for the element indicated by the probability data 330 and using the alphabet size for the element as indicated by the quantization mask 310 to perform the entropy decoding.

Figure 4A:
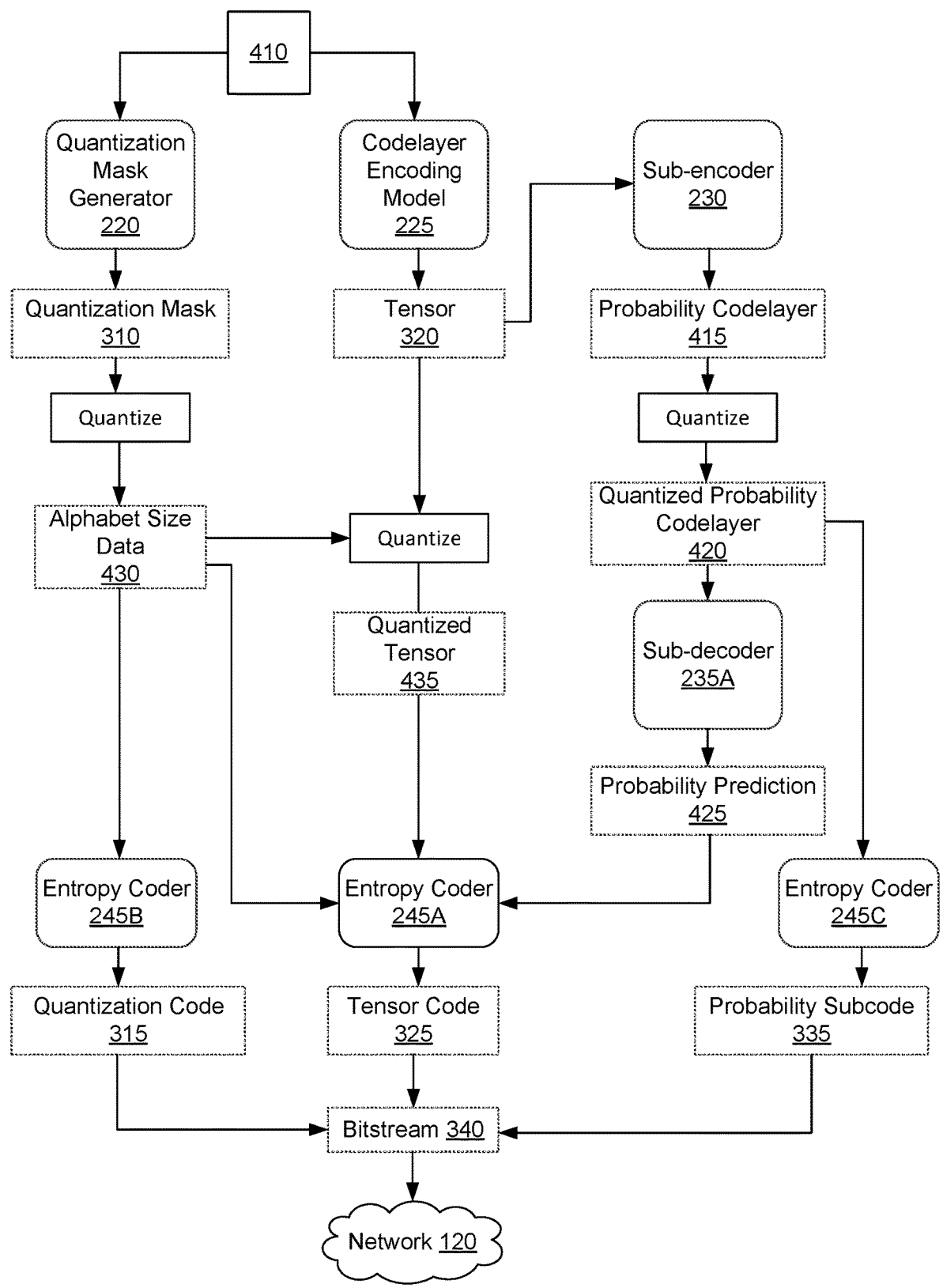
FIG. 4A illustrates a process for deploying an encoding system that includes a codelayer encoding model and a subnetwork, in accordance with an example embodiment.

FIG. 4A illustrates a process for deploying an encoding system 130 that includes a codelayer encoding model 225 and a subnetwork, in accordance with an example embodiment. The encoding system 130 receives an input 410 for compression. The input 410 may be any content format that the encoding system 130 is configured to process, for example, in various embodiments, the input 410 may be an image, a text file, an audio file, etc. Input 410 is provided to a codelayer encoding model 225 and a quantization mask generator 220.

The codelayer encoding model 225 is the encoding portion of an autoencoder comprising the codelayer encoding model 225 and a codelayer decoding model 265. The codelayer encoding model 225 produces a tensor 320 that represents the input 410.

In one embodiment, the quantization mask generator 220 is a neural network that has been trained to produce a quantization mask 310 based on the input 410. The quantization mask 310 is quantized to produce the alphabet size data 430. In one embodiment, the quantization module 240 performs the quantization of the quantization mask 310. In one embodiment, the quantized quantization mask 310 is the alphabet size data 430. For example, the quantization module 240 may use the information in the quantization mask 310 to generate alphabet size data 430 comprising a tensor that includes an alphabet size that can be associated with each element of the tensor 320 that represents the input 410.

The alphabet size data 430 is used by the quantization module 240 to quantize the tensor 320. In particular, the quantization module 240 quantizes the value at each element of the tensor 320 using the alphabet size associated with that element of the tensor 320 as indicated by the alphabet size data 430. For example, an element of the tensor 320 having a particular value and an associated alphabet size of 4 may be assigned in the quantized tensor 435 the closest value from the four alphabet options, and another element of the tensor 320 having the same value but associated with an alphabet size of 16 may be assigned to the closest available value from the sixteen alphabet options. Thus portions of the input 410 that require more detailed reconstruction as indicated by the quantization mask 310, are represented in additional detail in the quantized tensor 435.

In the example embodiment of FIG. 4A, a separate autoencoder network comprising a sub-encoder 230 and a sub-decoder 235A is used to determine probability values to use for entropy coding each element of the quantized tensor 435. The sub-encoder 230 is a neural network structure that is trained to generate a probability codelayer 415 based on the tensor 320 that is produced at the codelayer encoding model 225. In one embodiment, the sub-network is trained using labeled probability data as may be generated by sequentially determining probabilities based on previously determined probability values. The probability codelayer 415 may comprise a tensor of values that represent the tensor 320 in a way that is usable for predicting probabilities. In some embodiments, the probability codelayer 415 also provides a first compression step in compressing probability data for inclusion in a bitstream 340.

The quantization module 240 quantizes the probability codelayer 415 to generate a quantized probability codelayer 420. The quantized probability codelayer 420 is a quantized version of the probability codelayer 415. In some embodiments, such quantization of the probability codelayer 415 is performed so that the probability data can be compressed using a form of entropy encoding for inclusion in the bitstream 340.

The sub-decoder 235A is the decoding portion of the autoencoder subnetwork. the sub-decoder 235A comprises a neural network that is trained to predict probability values related to the tensor 320. The sub-decoder 235A receives the quantized probability codelayer 420 as input and generates a probability prediction 425. The probability prediction 425 includes a probability of the possible value of each tensor element of the tensor 320. The format of data in the probability prediction 425 can vary in different embodiments, depending on how the sub-decoder 235A is configured and trained to produce the probability prediction 425. In one embodiment, the probability prediction 425 includes tensors that identify probability distributions that represent the likelihood of each tensor element 320 having certain values.

Such probability distributions may use any appropriate parametric form. In one example, the probability prediction 425 comprises two tensors having the same number of elements as the tensor 320. One of the two tensors in this example includes a mean value for each of the corresponding elements of tensor 320 and the other of the two tensors in the example includes a standard deviation value for each of the corresponding elements of tensor 320. Together, the two tensors store a Gaussian distribution for each of the tensor 320 element values over the possible values.

In another example embodiment, the probability prediction 425 may include a plurality of tensors wherein each of the tensors represents likelihoods associated with a single possible element value. For example, if each element of the tensor could potentially be one of sixty-four values, then the probability prediction 425 would include sixty-four tensors, each including the probabilities of the associated alphabet value at each of the tensor 320 elements.

The entropy coder 245A uses a variant of entropy coding to compress the quantized tensor 435. In particular, each element of the quantized tensor 435 is encoded using the associated alphabet size for that element from the alphabet size data 430 and using the probability values associated with the value of that element as described by the probability prediction 425. The compressed quantized tensor 435, as produced by the entropy coder 245A, is referred to herein as the tensor code 325.

In the example embodiment of the FIG. 4A, an entropy coder 245B compresses the alphabet size data 430 to produce a quantization code 315 and an entropy coder 245C compresses the quantized probability codelayer 420 to produce a probability subcode 335. The bitstream generator 250 combines the quantization code 315, the tensor code 325, and the probability subcode 335 into a bitstream 340. In one example embodiment, the bitstream 340 is transmitted over the network 120.

Figure 4B:
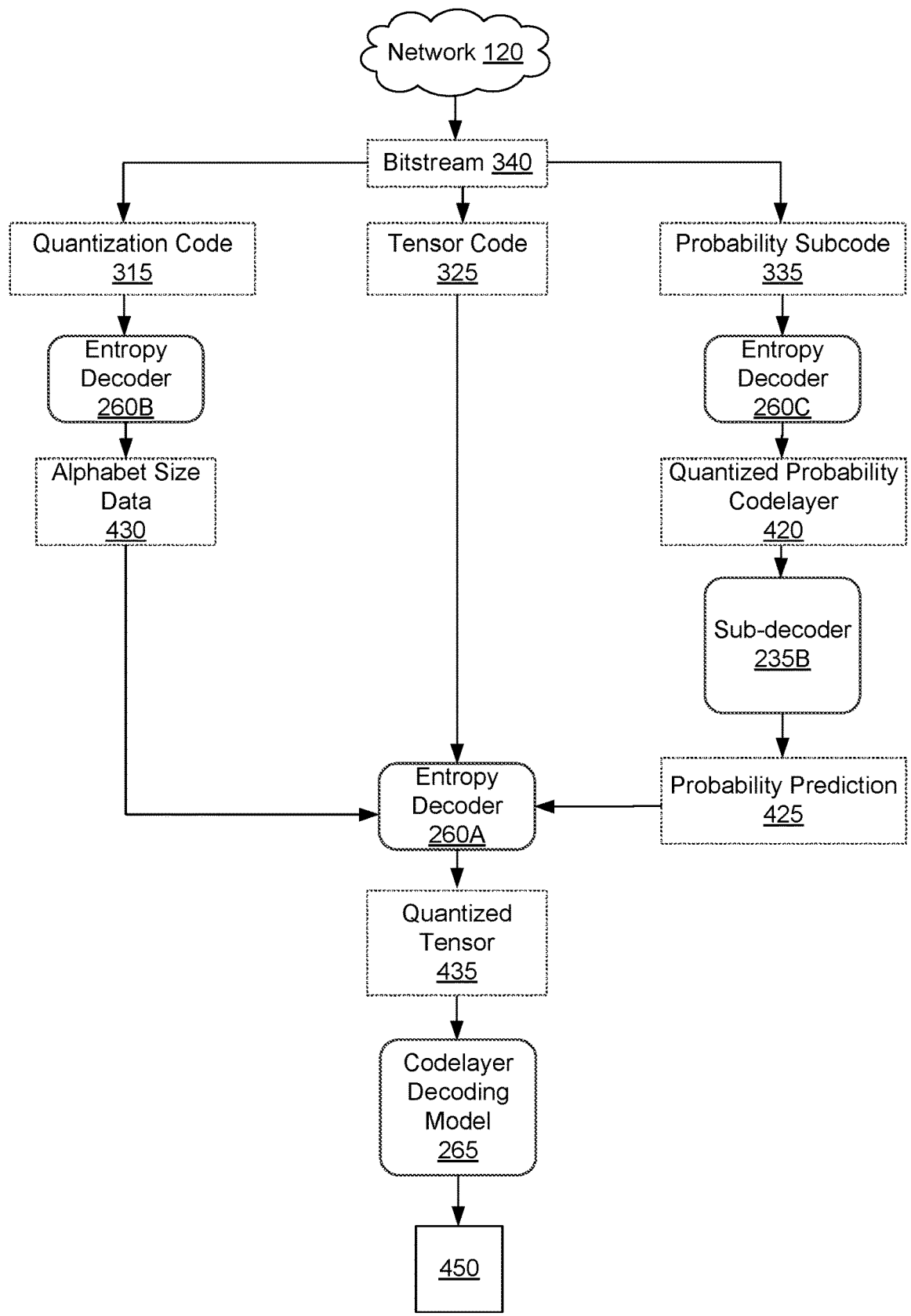
FIG. 4B illustrates a process for deploying a decoding system that includes a codelayer decoding model and a subnetwork, in accordance with an example embodiment.

FIG. 4B illustrates a process for deploying a decoding system 140 that includes a codelayer decoding model 265 and a subnetwork, in accordance with an example embodiment. The decoding system 140 receives a bitstream 340, for example, over the network 120. The bitstream analyzer 255 separates the bitstream 340 into the quantization code 315, the tensor code 325, and the probability subcode 335. An entropy decoder 260B decompresses the quantization code 315 to obtain the alphabet size data 430. An entropy decoder 260C decompresses the probability subcode 335 to obtain the quantized probability codelayer 420.

The quantized probability codelayer 420 is provided as input to the sub-decoder 235B. The sub-decoder 235B is a copy of the sub-decoder 235A that is included in the encoding system 130 as shown in the example embodiment of FIG. 4A. The sub-decoder 235B performs the same function as the sub-decoder 235A, and produces the probability prediction 425.

The tensor code 325, the alphabet size data 430, and the probability prediction 425 are provided to an entropy decoder 260A. The entropy decoder 260A uses the alphabet size data 430 and probability prediction 425 to apply an entropy decoding algorithm to decode each of the values of the elements of a tensor that are compressed in the tensor code 325. The entropy decoder 260A outputs a quantized tensor 435.

The quantized tensor 435 is provided as input to the codelayer decoding model 265. The codelayer decoding model 265 is the decoding portion of an autoencoder that comprises the codelayer encoding model 225 and the codelayer decoding model 265. Given a quantized tensor 435, the codelayer decoding model 265 produces a reconstructed content item 450 that is a reconstructed version of the input 410.

Figure 5:
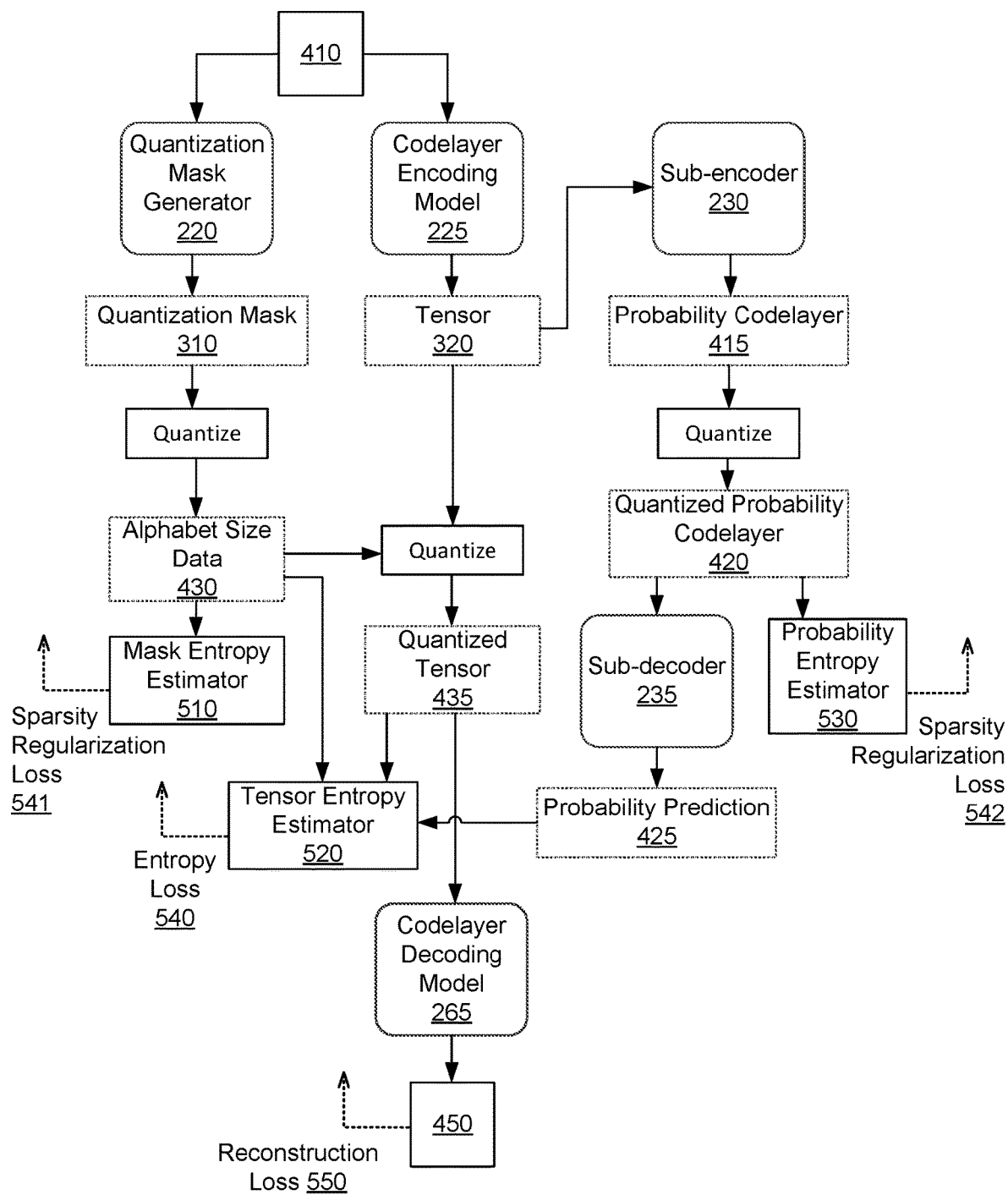
FIG. 5 illustrates a process for training an adaptive quantization system, in accordance with one example embodiment.

FIG. 5 illustrates a process for training an adaptive quantization system, in accordance with one example embodiment. The example depicted in FIG. 5 includes an autoencoder for generating and reconstructing a tensor 320 to which the adaptive quantization is applied. The example of FIG. 5 also includes a subnetwork for generating probability predictions 425 and a quantization mask generator 220. In various embodiments, an adaptive quantization system may include different combinations of these modules and the system may be configured differently than the example system shown herein.

An input 410 is provided to the adaptive quantization system. During the training process, the adaptive quantization system is provided with a plurality of training inputs 410. For example, a system that is being trained to compress and reconstruct images might receive many training images as inputs 410 during the training process.

In the example configuration of FIG. 5, the input 410 is provided to the quantization mask generator 220 and the codelayer encoding model 225. As in the deployment of the encoding system 130, described in FIG. 4A, the quantization mask generator 220 produces a quantization mask 310. The quantization module 240 quantizes the quantization mask 310 to produce alphabet size data 430.

The codelayer encoding model 225 also receives the training input 410. Using the existing weights, the neural network of the codelayer encoding model 225 generates a tensor 320. The quantization module 240 quantizes the tensor 320 to produce the quantized tensor 435. The quantized tensor 435 is provided as input to the codelayer decoding model 265. The codelayer decoding model 265 uses the current weights associated with its neural network architecture to produce a reconstructed input 450.

The sub-encoder 230 receives the tensor 320 as input and uses the current weights of its neural network to produce a probability codelayer 415. The quantization module 240 quantizes the probability codelayer 415 to produce a quantized probability codelayer 420. The sub-decoder 235 uses the current weights associated with its neural network to generate a probability prediction 425.

In one embodiment, the adaptive quantization system uses the alphabet size data 430, the quantized tensor 435, the probability prediction 425, and the reconstructed input 450 to determine loss values for use in backpropagating error through the various modules. The error backpropagation updates the weights of the neural networks that are included in the adaptive quantization system. In this way, as additional training inputs 410 are provided to the system, neural networks of the quantization mask generator 220, codelayer encoding model 225, codelayer decoding model 265, sub-encoder 230, and sub-decoder 235 are trained to produce more useable intermediate code layers and more accurate outputs.

In one embodiment, the loss function includes a reconstruction loss 550 that represents a dissimilarity between the original training input 410 and the reconstructed version of the training input 450. The adaptive quantization system reduces the loss function by repeatedly iterating between a forward pass step and a backpropagation step. During the forward pass step, the adaptive quantization system generates the reconstructed input 450 by applying the codelayer encoding model 225 and the codelayer decoding model 265 with an estimated set of parameters to training input 410. During the backpropagation step, the adaptive quantization system determines the reconstruction loss 550 based on dissimilarity between the reconstructed input 450 and the training input 410. The adaptive quantization system repeatedly updates the estimated set of parameters by backpropagating error terms obtained from the loss function to determine the final set of parameters.

In some embodiments, the adaptive quantization system jointly trains the codelayer encoding model 225, the codelayer decoding model 265, the quantization mask generator 220, and the subnetwork that includes the sub-encoder 230 and the sub-decoder 235. In such embodiments, the loss function may additionally incorporate some or all of an entropy loss 540, a sparsity regularization loss 541 associated with the quantization mask generator 220, and a sparsity regularization loss 542 associated with the subnetwork. These losses are similarly reduced by the adaptive quantization system during the repeated iterations between a forward pass step and a backpropagation step to train parameters of the neural networks. In some embodiments, the quantization mask generator 220 may use the loss function during training to allot a large alphabet size for quantizing tensor elements to account for more detailed information and similarly a smaller alphabet size for less detailed information.

A tensor entropy estimator 520 receives the quantized tensor 435, the probability prediction 425, and the alphabet data size 430 as input and outputs an estimation of a codelength that will result from entropy coding the quantized tensor 435. Since the entropy coding process itself is lossless, and since it is not feasible to backpropagate data through the entropy coding process, the estimation from the tensor entropy estimator 520 is used instead to determine the entropy loss 540. Similarly, a mask entropy estimator 510 determines a sparsity regularization loss 541 that represents an estimated codelength that will be output from entropy coding the alphabet size data 430 to generate the quantization code 315. A probability entropy estimator 530 receives the quantized probability codelayer 420 as input and outputs a sparsity regularization loss 542 that represents an estimated codelength that will be output from entropy coding the quantized probability codelayer. During training at the backpropagation step, these loss function values are reduced by adjusting the parameters of the quantization mask generator 220, the codelayer encoding model 225, the codelayer decoding model 265, the sub-encoder, and the sub-decoder until the loss satisfies a predetermined criteria.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

Some of the figures use like reference numerals to identify like elements. A letter after a reference numeral, such as "105A," indicates that the text refers specifically to the element having that particular reference numeral. A reference numeral in the text without a following letter, such as "105," refers to any or all of the elements in the figures bearing that reference numeral (e.g., "105" in the text would refer to reference numerals "105A" and/or "105B" in the figures).

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by one or more computer processors for performing any or all of the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A computer-implemented encoding method comprising:
   receiving a tensor for compression, the tensor divided into a set of elements wherein each element includes a value;
   obtaining a quantization mask associated with the tensor, the quantization mask indicating, for each of the set of elements into which the tensor is divided, an alphabet size associated with the element, wherein an alphabet size is a number of values that may be used to quantize the data of a tensor element;
   generating a quantized tensor by quantizing the tensor using information from the quantization mask, wherein quantizing the tensor comprises quantizing each element of the tensor using the alphabet size associated with the element, as indicated in the quantization mask;
   generating, based on the received tensor, a probability prediction comprising a probability distribution associated with each element of the tensor over the possible values of elements of the tensor; and
   compressing the quantized tensor into a tensor code using entropy coding, wherein a probability used to code each element of the quantized tensor is obtained from the probability distribution.

2. The encoding method of claim 1, wherein values of the quantization mask are based on the values of the tensor.

3. The encoding method of claim 2, further comprising generating the quantization mask, wherein the quantization mask is generated by a quantization mask prediction system that is trained using loss functions to identify areas of importance in tensor data.

4. The encoding method of claim 2, wherein the values of the quantization mask are selected to result in a spatially constant quality of a reconstruction of the tensor.

5. The encoding method of claim 2, wherein the values of the quantization mask are selected to result, for each spatial location of the tensor, in a minimum quality improvement per unit bitrate above a threshold value.

6. The encoding method of claim 1, further comprising:
   for each element of the quantized tensor:
      adjusting the value of the element to minimize a weighted average of an entropy of compressing the element and a difference between the value of the element and the adjusted value of the element.

7. The encoding method of claim 1, wherein the entropy coding algorithm is based on the Asymmetric Numeral Systems algorithm.

8. The encoding method of claim 1, wherein generating a probability prediction comprises:

projecting the tensor through a neural network that is trained to predict probability distributions of values of elements of a tensor.

9. The encoding method of claim 8, wherein generating a probability distribution associated with each element of the tensor further comprises predicting a probability value for each possible alphabet element for each element of the tensor.

10. The encoding method of claim 8, wherein generating a probability distribution associated with each element of the tensor further comprises predicting a parametric form for each element of the tensor that can be used to compute a probability for each possible alphabet element.

11. The encoding method of claim 10, wherein the parametric form comprises a predicted mean and a predicted variance of a Gaussian distribution.

12. The encoding method of claim 8, wherein the trained neural network uses integer-only math such that the predicted probability distributions will be the same across differing hardware architectures.

13. A computer-implemented decoding method comprising:
obtaining a compressed tensor code, wherein a tensor is divided into a set of elements, each element including a value;
obtaining a compressed quantization mask, wherein the quantization mask is associated with the tensor code, the quantization mask indicating, for each of a set of elements into which the tensor is divided, an alphabet size associated with the element, wherein an alphabet size is a number of values that may be used to quantize the data of a tensor element;
obtaining a compressed probability prediction, wherein the probability prediction comprises a set of probability distributions, each probability distribution associated with an element of the tensor over possible elements of the tensor;
decoding the compressed quantization mask to obtain the quantization mask;
decoding the compressed probability prediction to obtain the probability prediction; and
decompressing the compressed tensor code using an entropy decoding algorithm wherein each element of the tensor code is decoded using the associated alphabet indicated by the quantization mask and the associated probability distribution indicated by the probability prediction.

14. The computer-implemented decoding method of claim 13, wherein the values of the quantization mask are related to the values of the tensor.

15. The computer-implemented decoding method of claim 13, wherein the entropy decoding algorithm is based on the Asymmetric Numeral Systems algorithm.

16. The computer-implemented decoding method of claim 13, further comprising:
obtaining a probability distribution over each element of the tensor by projecting the probability prediction through a decoder portion of a neural network that is trained to predict probability distributions of values of elements of a tensor.

17. The computer-implemented decoding method of claim 16, wherein obtaining a probability distribution over each element of the tensor comprises generating a probability value for each possible alphabet element for each component of the tensor.

18. The computer-implemented decoding method of claim 16, wherein obtaining a probability distribution over each element of the tensor comprises generating for each element of the tensor, a predicted parametric form that can be used to compute a probability for each possible alphabet element.

19. The computer-implemented decoding method of claim 18, wherein the parametric form comprises a predicted mean and a predicted variance of a Gaussian distribution.

20. The computer-implemented decoding method of claim 16, wherein the trained neural network uses integer-only math such that the probability prediction will be the same across differing hardware architectures.

21. A non-transitory computer-readable storage medium storing computer program instructions executable by one or more processors of a system to perform encoding steps comprising:
receiving a tensor for compression, the tensor divided into a set of elements wherein each element includes a value;
obtaining a quantization mask associated with the tensor, the quantization mask indicating, for each of the set of elements into which the tensor is divided, an alphabet size associated with the element, wherein an alphabet size is a number of values that may be used to quantize the data of a tensor element;
generating a quantized tensor by quantizing the tensor using information from the quantization mask, wherein quantizing the tensor comprises quantizing each element of the tensor using the alphabet size associated with the element, as indicated in the quantization mask;
generating, based on the received tensor, a probability prediction comprising a probability distribution associated with each element of the tensor over the possible values of elements of the tensor; and
compressing the quantized tensor into a tensor code using entropy coding, wherein a probability used to code each element of the quantized tensor is obtained from the probability distribution.

22. The non-transitory computer-readable storage medium of claim 21, wherein values of the quantization mask are based on the values of the tensor.

23. The non-transitory computer-readable storage medium of claim 22, the steps further comprising generating the quantization mask, wherein the quantization mask is generated by a quantization mask prediction system that is trained using loss functions to identify areas of importance in tensor data.

24. The non-transitory computer-readable storage medium of claim 22, wherein the values of the quantization mask are selected to result in a spatially constant quality of a reconstruction of the tensor.

25. The non-transitory computer-readable storage medium of claim 22, wherein the values of the quantization mask are selected to result, for each spatial location of the tensor, in a minimum quality improvement per unit bitrate above a threshold value.

26. The non-transitory computer-readable storage medium of claim 21, the steps further comprising:
for each element of the quantized tensor:
adjusting the value of the element to minimize a weighted average of an entropy of compressing the element and a difference between the value of the element and the adjusted value of the element.

27. The non-transitory computer-readable storage medium of claim 21, wherein the entropy coding algorithm is based on the Asymmetric Numeral Systems algorithm.

28. The non-transitory computer-readable storage medium of claim 21, wherein generating a probability prediction comprises:
projecting the tensor through a neural network that is trained to predict probability distributions of values of elements of a tensor.

29. The non-transitory computer-readable storage medium of claim 28, wherein generating a probability distribution associated with each element of the tensor further comprises predicting a probability value for each possible alphabet element for each element of the tensor.

30. The non-transitory computer-readable storage medium of claim 28, wherein generating a probability distribution associated with each element of the tensor further comprises predicting a parametric form for each element of the tensor that can be used to compute a probability for each possible alphabet element.

31. The non-transitory computer-readable storage medium of claim 30, wherein the parametric form comprises a predicted mean and a predicted variance of a Gaussian distribution.

32. The non-transitory computer-readable storage medium of claim 28, wherein the trained neural network uses integer-only math such that the predicted probability distributions will be the same across differing hardware architectures.

33. A non-transitory computer-readable storage medium storing computer program instructions executable by one or more processors of a system to perform decoding steps comprising:
obtaining a compressed tensor code, wherein a tensor is divided into a set of elements, each element including a value;
obtaining a compressed quantization mask, wherein the quantization mask is associated with the tensor code, the quantization mask indicating, for each of a set of elements into which the tensor is divided, an alphabet size associated with the element, wherein an alphabet size is a number of values that may be used to quantize the data of a tensor element;
obtaining a compressed probability prediction, wherein the probability prediction comprises a set of probability distributions, each probability distribution associated with an element of the tensor over possible elements of the tensor;
decoding the compressed quantization mask to obtain the quantization mask;
decoding the compressed probability prediction to obtain the probability prediction; and
decompressing the compressed tensor code using an entropy decoding algorithm wherein each element of the tensor code is decoded using the associated alphabet indicated by the quantization mask and the associated probability distribution indicated by the probability prediction.

34. The non-transitory computer-readable storage medium of claim 33, wherein the values of the quantization mask are related to the values of the tensor.

35. The non-transitory computer-readable storage medium of claim 33, wherein the entropy decoding algorithm is based on the Asymmetric Numeral Systems algorithm.

36. The non-transitory computer-readable storage medium of claim 33, the steps further comprising:
obtaining a probability distribution over each element of the tensor by projecting the probability prediction through a decoder portion of a neural network that is trained to predict probability distributions of values of elements of a tensor.

37. The non-transitory computer-readable storage medium of claim 36, wherein obtaining a probability distribution over each element of the tensor comprises generating a probability value for each possible alphabet element for each component of the tensor.

38. The non-transitory computer-readable storage medium of claim 36, wherein obtaining a probability distribution over each element of the tensor comprises generating for each element of the tensor, a predicted parametric form that can be used to compute a probability for each possible alphabet element.

39. The non-transitory computer-readable storage medium of claim 38, wherein the parametric form comprises a predicted mean and a predicted variance of a Gaussian distribution.

40. The non-transitory computer-readable storage medium of claim 36, wherein the trained neural network uses integer-only math such that the probability prediction will be the same across differing hardware architectures.

* * * * *